United States Patent
Song et al.

(10) Patent No.: US 11,670,530 B2
(45) Date of Patent: *Jun. 6, 2023

(54) CASSETTE FOR SUBSTRATES OF DISPLAY DEVICES

(71) Applicant: Samsung Display Co., LTD., Yongin-si (KR)

(72) Inventors: Youngdae Song, Busan (KR);
Kyeong-Min Kim, Asan-si (KR);
Myungjong Kim, Seoul (KR);
Euiyoung Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/843,622

(22) Filed: Jun. 17, 2022

(65) Prior Publication Data

US 2022/0392794 A1 Dec. 8, 2022

Related U.S. Application Data

(63) Continuation of application No. 17/095,668, filed on Nov. 11, 2020, now Pat. No. 11,367,639.

(30) Foreign Application Priority Data

Feb. 6, 2020 (KR) .......................... 10-2020-0014506

(51) Int. Cl.
*H01L 21/673* (2006.01)

(52) U.S. Cl.
CPC .. *H01L 21/67326* (2013.01); *H01L 21/67313* (2013.01)

(58) Field of Classification Search
CPC .......... H01L 21/67326; H01L 21/6734; H01L 21/67313; H01L 21/67316; H01L 21/6733;

(Continued)

(56) References Cited

U.S. PATENT DOCUMENTS 3,850,296 A 11/1974 Hirata et al.
4,566,839 A 1/1986 Butler
(Continued)

FOREIGN PATENT DOCUMENTS

CN 112242096 1/2021
KR 10-2004-0062135 7/2004
(Continued)

OTHER PUBLICATIONS

Non-Final Office Action dated Oct. 15, 2021, in U.S. Appl. No. 17/095,668.

(Continued)

*Primary Examiner* — Jennifer E. Novosad

(74) *Attorney, Agent, or Firm* — H.C. Park & Associates, PLC

(57) ABSTRACT

A cassette for receiving at least one substrate for a display device includes a base; and a first wall extending in a direction generally perpendicular to an upper surface of the base and a plurality of first projections extending from the first wall in a first direction and arranged in a second direction generally perpendicular to the first direction at substantially regular intervals. A first opening is defined between adjacent first projections to receive one end of a first substrate, the first opening includes a first portion having a first width in the second direction and a second portion having a second width greater than the first width, and the first portion is disposed closer to the first wall than the second portion.

11 Claims, 8 Drawing Sheets

(58) Field of Classification Search
CPC .......... H01L 21/67303; H01L 21/6732; H01L 21/67323
USPC .......... 211/70.6, 41.13, 41.18; 206/832, 833, 206/454, 710, 711; 414/935, 936, 938
See application file for complete search history.

(56) References Cited

U.S. PATENT DOCUMENTS

| | | | |
|---|---|---|---|
| 4,573,851 | A | 3/1986 | Butler |
| 4,574,950 | A | 3/1986 | Koe et al. |
| 4,724,963 | A | 2/1988 | Mortensen |
| 4,960,212 | A | 10/1990 | Wa |
| 4,981,222 | A | 1/1991 | Lee |
| 4,993,559 | A | 2/1991 | Cota |
| 5,429,251 | A | 7/1995 | Matthews |
| 5,534,074 | A | 7/1996 | Koons |
| 5,704,493 | A | 1/1998 | Fujikawa et al. |
| 5,706,946 | A | 1/1998 | Kakizaki et al. |
| 5,858,103 | A | 1/1999 | Nakajima et al. |
| 5,857,573 | A | 6/1999 | Pakeriasamy |
| 5,921,773 | A | 7/1999 | Lee |
| 5,931,666 | A | 8/1999 | Hengst |
| 6,110,285 | A | 8/2000 | Kitazawa et al. |
| 6,398,475 | B1 | 6/2002 | Ishikawa |
| 6,520,191 | B1 | 2/2003 | Iwamoto et al. |
| 6,959,823 | B2 | 11/2005 | Jun et al. |
| 6,994,217 | B2 | 2/2006 | Duban-Hu et al. |
| 7,225,925 | B2 | 6/2007 | Chen et al. |
| 7,500,564 | B2 * | 3/2009 | Choi ................. H01L 21/67383 211/41.18 |
| 7,815,056 | B2 | 10/2010 | Coppola et al. |
| 7,857,140 | B2 * | 12/2010 | Shinjo ................. H01L 21/6732 211/41.18 |
| 7,950,534 | B2 | 5/2011 | Kao |
| 8,006,842 | B1 * | 8/2011 | Loughlin, Jr. ..... B65D 21/0216 206/509 |
| 8,307,997 | B2 * | 11/2012 | Jonas ................. H01L 21/67313 211/41.18 |
| 8,777,008 | B2 | 7/2014 | Hu |
| 8,807,341 | B2 | 8/2014 | Chan et al. |
| 9,153,466 | B2 * | 10/2015 | Jdira ................. H01L 21/67309 |
| 9,502,274 | B2 | 11/2016 | Hong et al. |
| 9,597,791 | B2 | 3/2017 | Neal |
| 10,004,153 | B2 | 6/2018 | Koo et al. |
| 11,367,639 | B2 * | 6/2022 | Song ................. H01L 21/67326 |
| 2003/0085186 | A1 | 5/2003 | Fujioka et al. |
| 2004/0022607 | A1 | 2/2004 | Lim et al. |
| 2004/0045865 | A1 | 3/2004 | Jun et al. |
| 2006/0027513 | A1 | 2/2006 | Jun et al. |
| 2007/0062889 | A1 | 3/2007 | Salzmann |
| 2007/0125726 | A1 | 6/2007 | Seo |
| 2011/0259840 | A1 * | 10/2011 | Park ................. H01L 21/67323 211/41.18 |
| 2015/0068948 | A1 | 3/2015 | Hong et al. |
| 2016/0379859 | A1 | 12/2016 | Ogitsu |
| 2021/0016957 | A1 | 1/2021 | Song et al. |
| 2021/0249289 | A1 | 8/2021 | Song et al. |

FOREIGN PATENT DOCUMENTS

| | | |
|---|---|---|
| KR | 10-2017-0070307 | 6/2017 |
| KR | 10-2021-0010722 | 1/2021 |

OTHER PUBLICATIONS

Notice of Allowance dated Feb. 24, 2022, in U.S. Appl. No. 17/095,668.

* cited by examiner

CASSETTE FOR SUBSTRATES OF DISPLAY DEVICES

CROSS-REFERENCE TO RELATED APPLICATION

This application is a continuation of U.S. patent application Ser. No. 17/095,668, filed on Nov. 11, 2020, which claims priority from and the benefit of Korean Patent Application No. 10-2020-0014506, filed on Feb. 6, 2020, each of which is hereby incorporated by reference for all purposes as if fully set forth herein.

BACKGROUND

Field

Implementations of the invention relate generally to a cassette and more specifically, to a cassette for transporting a substrate of a display device.

Discussion of the Background

Substrates are essential for the manufacture of electrical and electronic circuits, semiconductors, and display devices. The substrates are formed of various types of materials, such as a synthetic resin, a glass, and a wafer. The substrates for the production of the electric and electronic circuits, semiconductors, and display devices are completed as a finished product through various processes. In this case, the substrates are accommodated in a transport device, such as a tray, and moved from one process line to another process line.

The above information disclosed in this Background section is only for understanding of the background of the inventive concepts, and, therefore, it may contain information that does not constitute prior art.

SUMMARY

Applicant discovered that when the slots between the ribs of a cassette for a substrate of a display device have a uniform or constant width along the longitudinal direction of the ribs, the ribs of the cassette may be damaged in a manufacturing process thereof, and the slots between the ribs of the cassette may not be formed in the shape of the used in the manufacturing process.

Cassettes for holding substrates of display devices constructed according to the principles of implementations of the invention are capable of preventing the ribs of the cassette from being damaged in the manufacturing process. For example, the slots between the ribs of the cassette may be curved and/or have widths that gradually increase in a longitudinal direction extending toward the inward opening of the slots.

Cassettes for holding substrates of display devices constructed according to the principles of implementations of the invention are capable of easily accommodating substrates of display devices having a curved edge and a thin thickness without damaging the tray or the substrate.

Additional features of the inventive concepts will be set forth in the description which follows, and in part will be apparent from the description, or may be learned by practice of the inventive concepts.

According to one aspect of the invention, a cassette for receiving at least one substrate for a display device includes a base; and a first wall extending in a direction generally perpendicular to an upper surface of the base and a plurality of first projections extending from the first wall in a first direction and arranged in a second direction generally perpendicular to the first direction at substantially regular intervals, wherein: a first opening is defined between adjacent first projections to receive one end of a first substrate, the first opening includes a first portion having a first width in the second direction and a second portion having a second width greater than the first width, and the first portion is disposed closer to the first wall than the second portion.

The first width may be substantially constant.

The second width may gradually increase inwardly in the first direction.

The first wall may include a first sidewall, and the first projections may include first ribs, and wherein each of the first ribs may include: a first outer surface having a first surface portion projecting from the first sidewall and being substantially parallel to the first direction and a second surface portion inclined from the first surface portion along the second direction; a second outer surface projecting from the first sidewall, facing the first outer surface, and being substantially parallel to the first surface portion; and a third outer surface connecting the first outer surface to the second outer surface.

The second surface portion of the first outer surface may be closer the second outer surface of the first outer surface in the second direction than the first surface portion of the first outer surface.

The third outer surface may include a curved surface.

The cassette may further include a second wall facing the first wall in the first direction, wherein the second wall extends in a direction generally perpendicular to the upper surface of the base and may include: a plurality of second projections facing the first projections, projecting from the second wall in the first direction, and arranged in the second direction at substantially regular intervals, and second opening defined between adjacent second projections to receive the other end of the first substrate.

The second opening may include a third portion having the first width and a fourth portion having the second width, and the third portion may be disposed closer to the second wall than the fourth portion.

The first and second openings may include first and second slots, respectively, and the second slot has a shape substantially linearly symmetrical to the first slot.

The first wall may include a first sidewall, the first projections may include first ribs, the second wall may include a second side wall, and the second projections may include second ribs. The second ribs may have a shape substantially linearly symmetrical to the first ribs, respectively.

The cassette may further include a third wall, wherein: the second wall may further include a plurality of third projections substantially linearly symmetrical to the second projections with respect to the second wall, and the third wall may extend in the direction substantially perpendicular to the upper surface of the base, and may include a plurality of fourth projections facing the third projections, projecting from the third wall in the first direction, and arranged in the second direction at substantially regular intervals.

A third opening may be defined between adjacent third projections to receive one end of a second substrate, a fourth opening may be defined between adjacent fourth projections to receive the other end of the second substrate is accommodated, the third opening may include a fifth portion having the first width in the second direction and a sixth portion having the second width in the second direction, the fourth opening may include a seventh portion having the first width and an eighth portion having the second width in the second direction, the fifth portion may be closer to the second wall than the sixth portion, and the seventh portion may be closer to the third wall than the eighth portion.

The fourth opening may have a shape substantially linearly symmetrical to the third opening.

The first substrate may include: a substantially flat portion; a first edge portion bent from one end of the substantially flat portion and accommodated in the first opening; and a second edge portion bent from the other end of the substantially flat portion and accommodated in the second opening.

The first wall may include a first sidewall, and the first projections may include first ribs, and wherein each of the first ribs may include: a first outer surface projecting from the first sidewall and inclined along the second direction; a second outer surface projecting from the first sidewall, facing the first outer surface, and being substantially parallel to the first direction; and a third outer surface connecting the first outer surface to the second outer surface and including a curved surface in at least a portion thereof.

The first width may gradually increase along the first direction in the first opening, and the second width may gradually increase along the first direction in the second opening.

According to another aspect of the invention, a cassette for receiving at least one substrate for a display device includes: a base; a first wall and a second wall, which are spaced apart from each other in a first direction to face each other and extend in a direction substantially perpendicular to an upper surface of the base; and a plurality of first projections extending from the first wall in the first direction and arranged in a second direction substantially perpendicular to the first direction at substantially regular intervals and a plurality of second projections extending from the second wall in the first direction and arranged in the second direction at projections regular intervals, wherein each of the first projections includes: a first outer surface including a first portion protruding from the first wall and being substantially parallel to the first direction and a second portion inclined from the first portion along the second direction; and a second outer surface projecting from the first wall and being substantially parallel to the first portion.

The second portion may be closer to the second outer surface in the second direction than the first portion.

The second projections may have a shape substantially linearly symmetrical with respect to first projections, respectively.

The cassette may further include a third outer surface connecting the first outer surface to the second outer surface.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
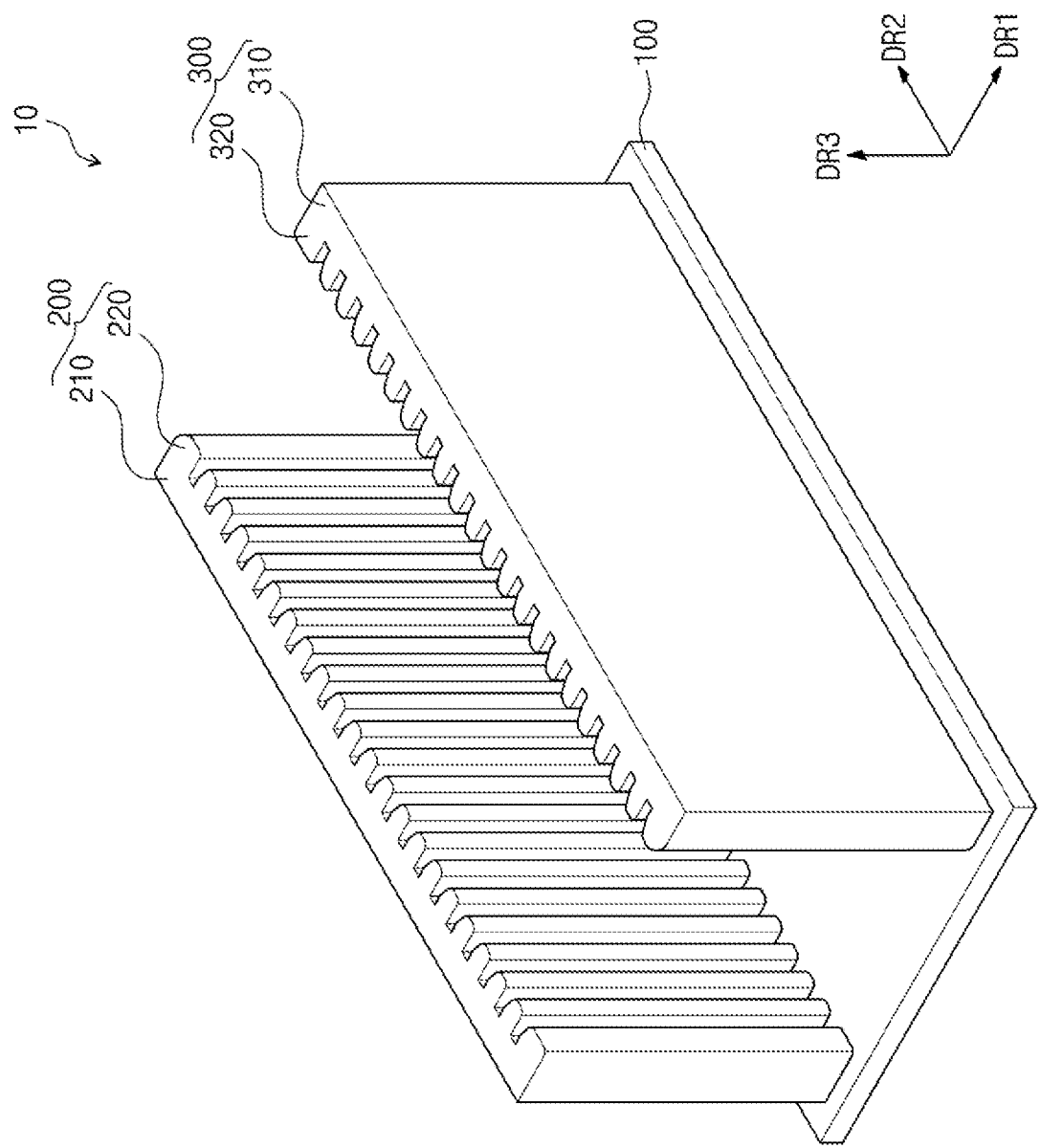
FIG. 1 is a perspective view of an embodiment of a cassette for holding substrates of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the illustrative term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, certain embodiments will be explained in detail with reference to the accompanying drawings.

Figure 2:
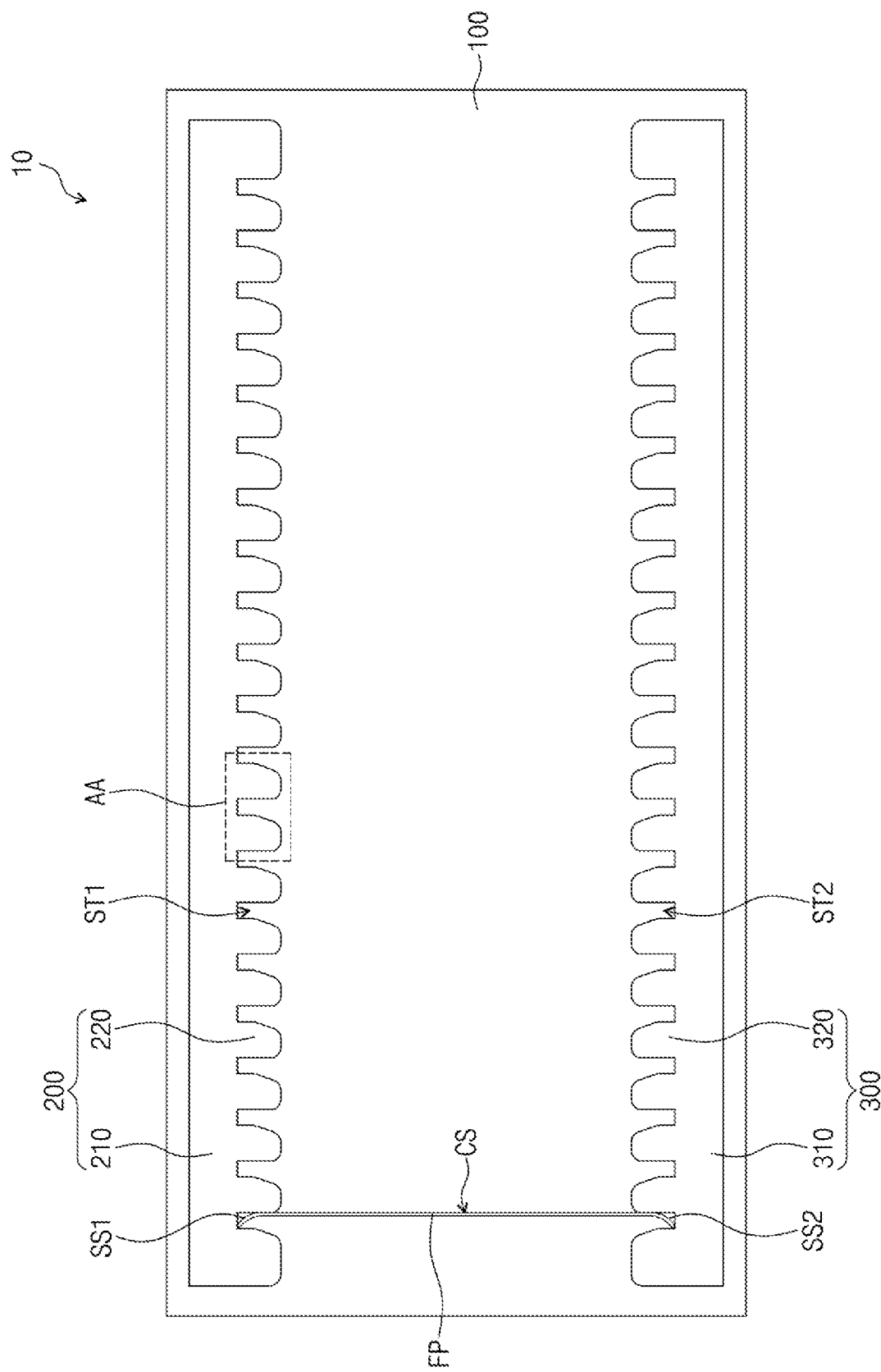
FIG. 2 is a plan view of the cassette of FIG. 1.

FIG. 1 is a perspective view of an embodiment of a cassette for holding substrates of a display device constructed according to the principles of the invention. FIG. 2 is a plan view of the cassette of FIG. 1.

Referring to FIGS. 1 and 2, a cassette for a substrate (hereinafter, referred to as a "substrate cassette") 10 may include a base in the form of a plate 100, a first wall in the form of an accommodating portion 200, and a second wall in the form of an accommodating portion 300. As used herein, "cassette" refers to any structure such as a, casing, container, housing, tray, etc., capable of supporting a plurality of display substrates.

The plate 100 may be any type of support member that is capable of supporting components of the substrate cassette 10 and a plurality of substrates accommodated in the substrate cassette 10. The plate 100 may be substantially parallel to a plane defined by a first direction DR1 and a second direction DR2. A normal line direction of the plate 100, i.e., a thickness direction of the plate 100, may indicate a third direction DR3.

In the following descriptions, the expression "when viewed in plan or on plane" means a state of being viewed in the third direction DR3. Front (or upper) and rear (or lower) surfaces of each layer or each unit are distinguished from each other in the third direction DR3. However, directions indicated by the first, second, and third directions DR1, DR2, and DR3 are relative to each other, and thus, the directions indicated by the first, second, and third directions DR1, DR2, and DR3 may be changed to other directions, for example, opposite directions.

The plate 100 may include a plastic substrate, a glass substrate, a metal substrate, or an organic/inorganic composite substrate. In addition, the plate 100 may include a paper material and may have a predetermined thickness to withstand or support the load of the substrates.

The first accommodating portion 200 may be adjacent to one end of the plate 100 in the first direction DR1, and the second accommodating portion 300 may be adjacent to the other end of the plate 100 in the first direction DR1. The first accommodating portion 200 and the second accommodating portion 300 may face each other in the first direction DR1 and may be disposed on the plate 100 to be spaced apart from each other.

According to the embodiments, a plurality of openings that may be in the forms of slots that accommodate at least one substrate CS may be defined in each of the first accommodating portion 200 and the second accommodating portion 300. In the illustrated embodiment, the substrate CS may be one substrate as one of components of the display device. In the following descriptions, the substrate CS will be described as a window of the display device purely for descriptive convenience.

Referring to FIG. 2, a plurality of first slots ST1 that accommodates one ends of the substrates CS may be defined in the first accommodating portion 200, and a plurality of second slots ST2 that accommodates the other ends of the substrates CS may be defined in the second accommodating portion 300.

In detail, the first accommodating portion 200 may include a first sidewall 210 and a plurality of first lateral projection that may be in the form of ribs 220. The first sidewall 210 may project from an upper surface of the plate 100 in the third direction DR3 and extend in the second direction DR2. The first ribs 220 may project in the first direction DR1 and may be arranged in the second direction DR2 at regular intervals. For example, the adjacent first ribs 220 may be spaced apart from each other by a substantially constant interval in the second direction DR2.

Each first slot ST1 may be defined by two first ribs 220 adjacent to each other. Each first slot ST1 may be an empty space between the two first ribs 220 adjacent to each other and spaced apart from each other by the substantially constant interval in the second direction DR2.

The second accommodating portion 300 may include a second sidewall 310 and a plurality of second ribs 320. The second sidewall 310 may project from the upper surface of the plate 100 in the third direction DR3 and extend in the second direction DR2. The second ribs 320 may project in the first direction DR1 and may be arranged in the second direction DR2 at regular intervals. For example, the adjacent second ribs 320 may be spaced apart from each other by a substantially constant interval in the second direction DR2. The second ribs 320 may respectively face the first ribs 220 in the first direction DR1.

Each second slot ST2 may be defined by two second ribs 320 adjacent to each other. Each second slot ST2 may be an empty space between the two second ribs 320 adjacent to each other and spaced apart from each other by the substantially constant interval in the second direction DR2.

In an embodiment, the plate 100, the first accommodating portion 200, and the second accommodating portion 300 may be integrally formed with each other. Each of the first sidewall 210 and the second sidewall 310 disposed on the plate 100 may project in the third direction DR3 from the plate 100. In addition, the first ribs 220 may project from the first sidewall 210 and be integrally formed with the first sidewall 210. The second ribs 320 may project from the second sidewall 310 and be integrally formed with the second sidewall 310.

In another embodiment, the plate 100, the first accommodating portion 200, and the second accommodating portion 300 may be separately formed from each other. In this case, a first hole in which the first sidewall 210 is disposed and a second hole in which the second sidewall 310 is disposed may be defined in the upper surface of the plate 100. Each of the first hole and the second hole may extend in the second direction DR2 and may be recessed from the upper surface of the plate 100. The first ribs 220 may project from the first sidewall 210 and be integrally formed with the first sidewall 210. The second ribs 320 may project from the second sidewall 310 and be integrally formed with the second sidewall 310.

The first ribs 220 and the second ribs 320 may have a linear symmetrical shape with respect to a reference line substantially parallel to the second direction DR2. The reference line may be a center line between the first accommodating portion 200 and the second accommodating portion 300. In other words, the first ribs 220 may respectively face the second ribs 320 in the first direction DR1 and may have a shape linearly symmetrical with respect to the second ribs 320.

Referring to FIG. 2, the substrate CS accommodated in the substrate cassette 10 may include a substantially flat portion FP, a first edge portion SS1 bent from one end of the substantially flat portion FP, and a second edge portion SS2 bent from the other end of the substantially flat portion FP. The substantially flat portion FP of the substrate CS may be supported by the plate 100. The first edge portion SS1 of the substrate CS may be supported by the first slot ST1, and the second edge portion SS2 of the substrate CS may be supported by the second slot ST2.

As described above, the substrate cassette 10 may accommodate the substrates CS by receiving the opposite ends of the substrates in the first slots ST1 and the second slots ST2. The first edge portion SS1 and the second edge portion SS2 of each of the substrates CS may be supported, respectively, by the one first slot ST1 and the one second slot ST2, which face each other in the first direction DR1 and are respectively defined by the first ribs 220 and the second ribs 320.

Figure 3:
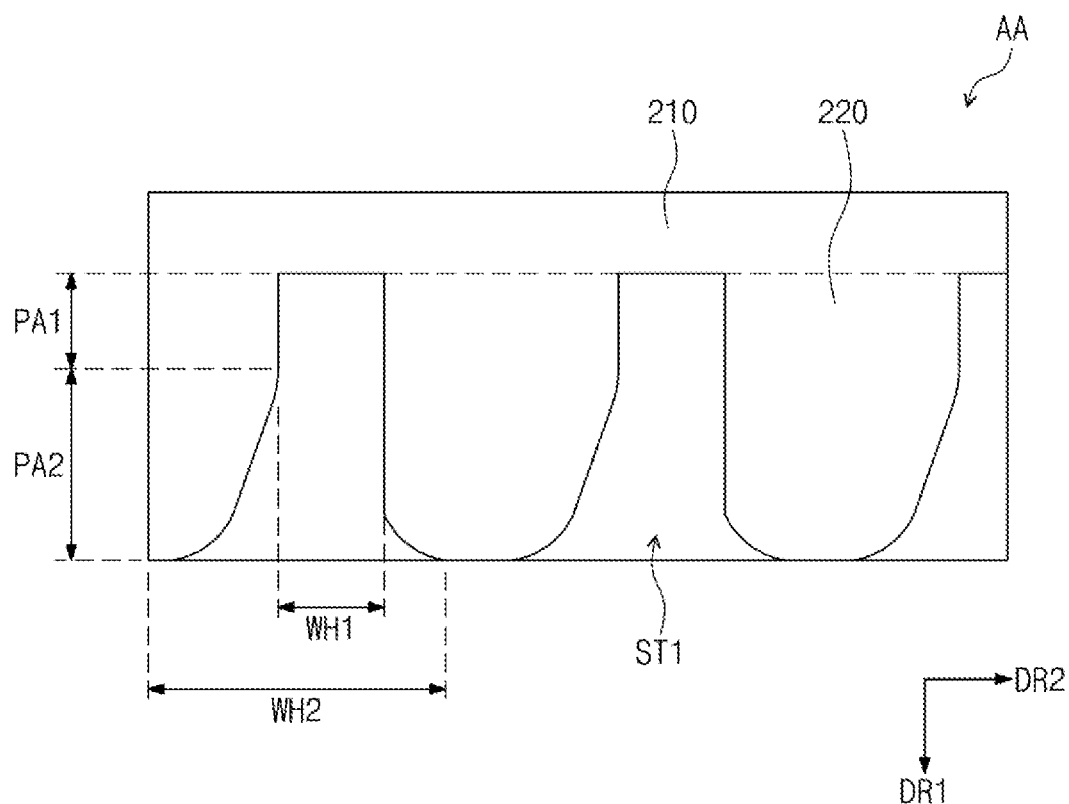
FIG. 3 is an enlarged view of area AA shown in FIG. 2.
Figure 4:
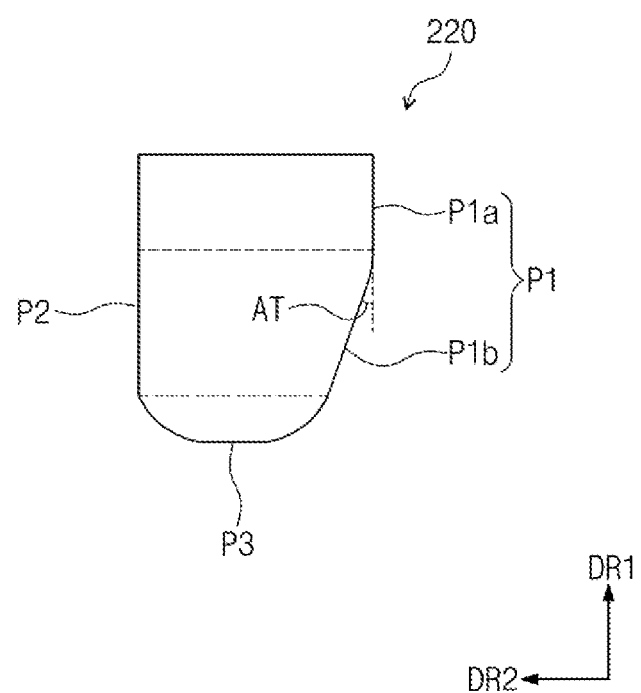
FIG. 4 is a plan view of a rib of the cassette of FIG. 3.
Figure 5:
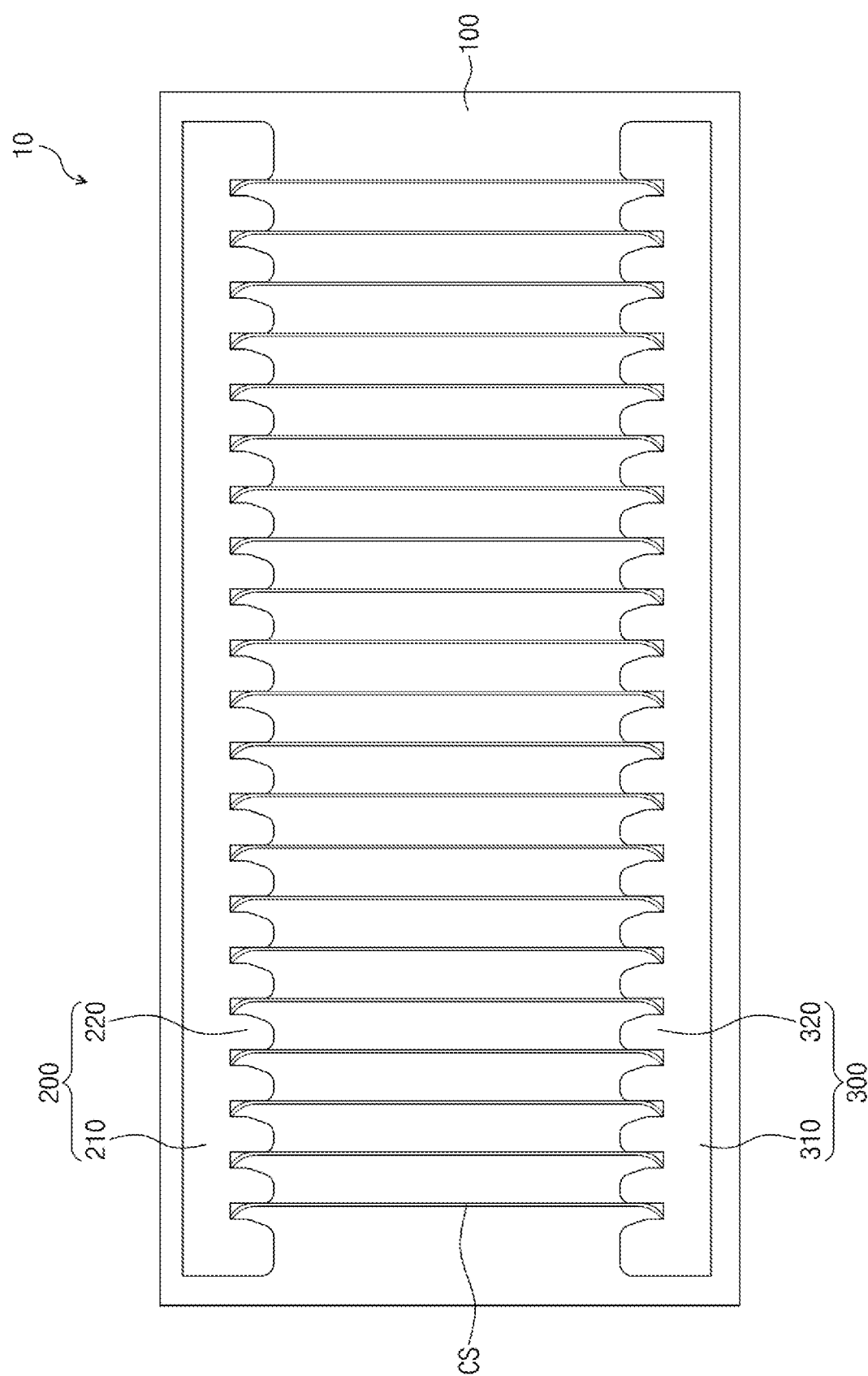
FIG. 5 is a plan view of the cassette of FIG. 1 illustrating the cassette having a plurality of substrates accommodated therein.

FIG. 3 is an enlarged view of area AA shown in FIG. 2. FIG. 4 is a plan view of a rib of the cassette of FIG. 3. FIG. 5 is a plan view of the cassette of FIG. 1 illustrating the cassette having a substrate accommodated therein.

FIGS. 3 and 4 show one or more ribs of the first ribs 220 included in the first accommodating portion 200 as a representative example, and each of the first ribs 220 may have a shape corresponding to the shape of the first rib 220 shown in FIGS. 3 and 4. Each of the second ribs 320 may have a shape linearly symmetrical to the first rib 220 shown in FIGS. 3 and 4.

In detail, referring to FIG. 3, each of the first ribs 220 may extend from the first sidewall 210 in the first direction DR1. In addition, the first slot ST1 may be defined between the two first ribs 220 adjacent to each other.

The first slot ST1 may include a first opening in the form of a first slot portion PA1 and a second opening in the form of a second slot portion PA2, and the first slot portion PA1 may be closer the first sidewall 210 than the second slot portion PA2 in the first direction DR1. Each of the first slot portion PA1 and the second slot portion PA2 may have a slot shape extending longitudinally in the first direction DR1.

The first slot portion PA1 may have a first width WH1 in the second direction DR2. The first width WH1 of the first slot portion PA1 may be substantially uniform in the longitudinal direction and may have a generally quadrangular shape when viewed in plan.

The second slot portion PA2 may have a second width WH2 in the second direction DR2. In particular, the second width WH2 of the second slot portion PA2 may be greater than the first width WH1 of the first slot portion PA1. The second width WH2 of the second slot portion PA2 may be defined by a plurality of sub-widths that gradually increase along the first direction DR1 in an inward direction away from the first sidewall 210. For instance, the second width WH2 of the second slot portion PA2 may increase as the distance from the first sidewall 210 increases in the first direction DR1. As shown in FIG. 3, the second width WH2 in the second slot portion PA2 may be greater than the first width WH1 in the first slot portion PA1.

The first edge portion SS1 of the substrate CS, which has a curved shape, may be disposed in the first slot portion PA1 of the first slot ST1. The second slot ST2 may be a space having a shape substantially linearly symmetrical to the first slot ST1 in the first direction DR1. For example, the second slot ST2 may include a third slot portion corresponding to the first slot portion PA1 of the first slot ST1 and a fourth slot portion corresponding to the second slot portion PA2 of the first slot ST1. As a result, the second edge portion SS2 of the substrate CS, which has a curved shape, may be received in the third slot portion of the second slot ST2.

Referring to FIG. 4, the first rib 220 may include a first outer surface P1, a second outer surface P2, and a third outer surface P3 when viewed in plan. The first outer surface P1 may include a first surface portion P1*a* projecting from the first sidewall 210 and in a direction substantially parallel to the first direction DR1 and a second surface portion P1*b* inclined from the first surface portion P1*a* in the second direction DR2. As an example, an angle AT formed between the first surface portion P1*a* and the second surface portion P1*b* may be within a range from about 15 degrees to about 25 degrees.

The second outer surface P2 may face the first outer surface P1 in the second direction DR2 and may project from the first sidewall 210. In particular, the second outer surface P2 may be substantially parallel to the first surface portion P1*a* of the first outer surface P1 and may be closer the second surface portion P1*b* in the second direction DR2 than the first surface portion P1*a*.

The third outer surface P3 may connect the second surface portion P1*b* of the first outer surface P1 to the second outer surface P2, and at least a portion of the third outer surface P3 may have a generally curved shape.

Referring to FIG. 3, the first width WH1 of the first slot portion PA1 may be within a range from about 1.5 micrometers to about 3.0 micrometers. In recent years, as the thickness of substrates of display devices has decreased, the width WH1 of the first slot portion PA1 may also decrease to correspond to the thickness of the substrates and better accommodate them without slippage or the like.

However, when the second width of the second slot portion PA2 is the same as the first width of the first slot portion PA1, the first ribs 220 or the second ribs 320 may be partially damaged during a process of making the substrate cassette 10. For instance, a process of forming the first accommodating portion 200 is as follows. A mother substrate containing a plastic material may be prepared. After a heat is applied to the mother substrate, the mother substrate may be pressed by a mold that is designed to correspond to the shape of the first and second ribs 220 and 320. Then, the heated mother substrate may be molded to fit the shape of the mold in a vacuum state.

For example, when both the first slot portion and the second slot portion have the first width, the vacuum state may not be maintained at the end of the first slot portion adjacent to the first sidewall through the second slot portion. In this case, the shape of the portion of the mother substrate corresponding to the first slot portion may be different from a reference shape, e.g., the shape of the mold.

However, according to principles and embodiments of the invention, the second width WH2 of the second slot portion PA2 may be greater than the first width WH1 of the first slot portion PA1. Thus, the vacuum state may be maintained at the end of the first slot portion PA1 through the second slot portion PA2 in the process in which the heated mother substrate is molded to fit the shape of the mold in the vacuum state. As a result, the shape of the portion of the mother substrate corresponding to the first slot portion PA1 may be the substantially same as the reference shape, e.g., the shape of the mold.

In addition, as the second width WH2 of the second slot portion PA2 is greater than the first width WH1 of the first slot portion PA1, the substrate CS may be more easily received in the slot and accommodated by the cassette.

As a result, as shown in FIG. 5, the substrates CS may be accommodated in the substrate cassette 10 by having their ends received in the first ribs 220 of the first accommodating portion 200 and the second ribs 320 of the second accommodating portion 300. FIG. 5 shows the substrate cassette 10 that accommodates plural substrates CS, but embodiments are not limited thereto. For example, the substrate cassette 10 may have a structure in which one substrate CS is accommodated.

Figure 6:
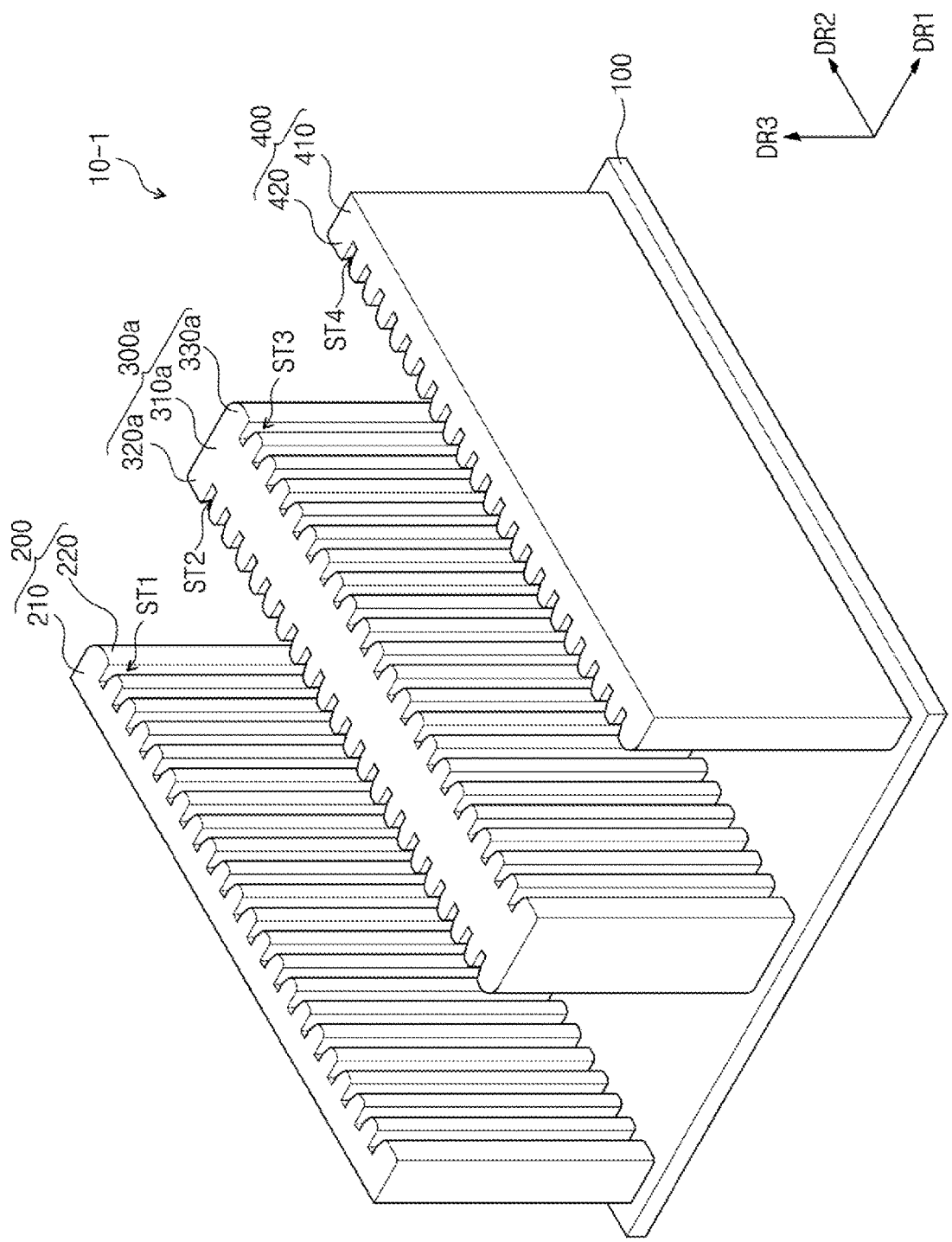
FIG. 6 is a perspective view of another embodiment of the cassette constructed according to the principles of the invention.
Figure 7:
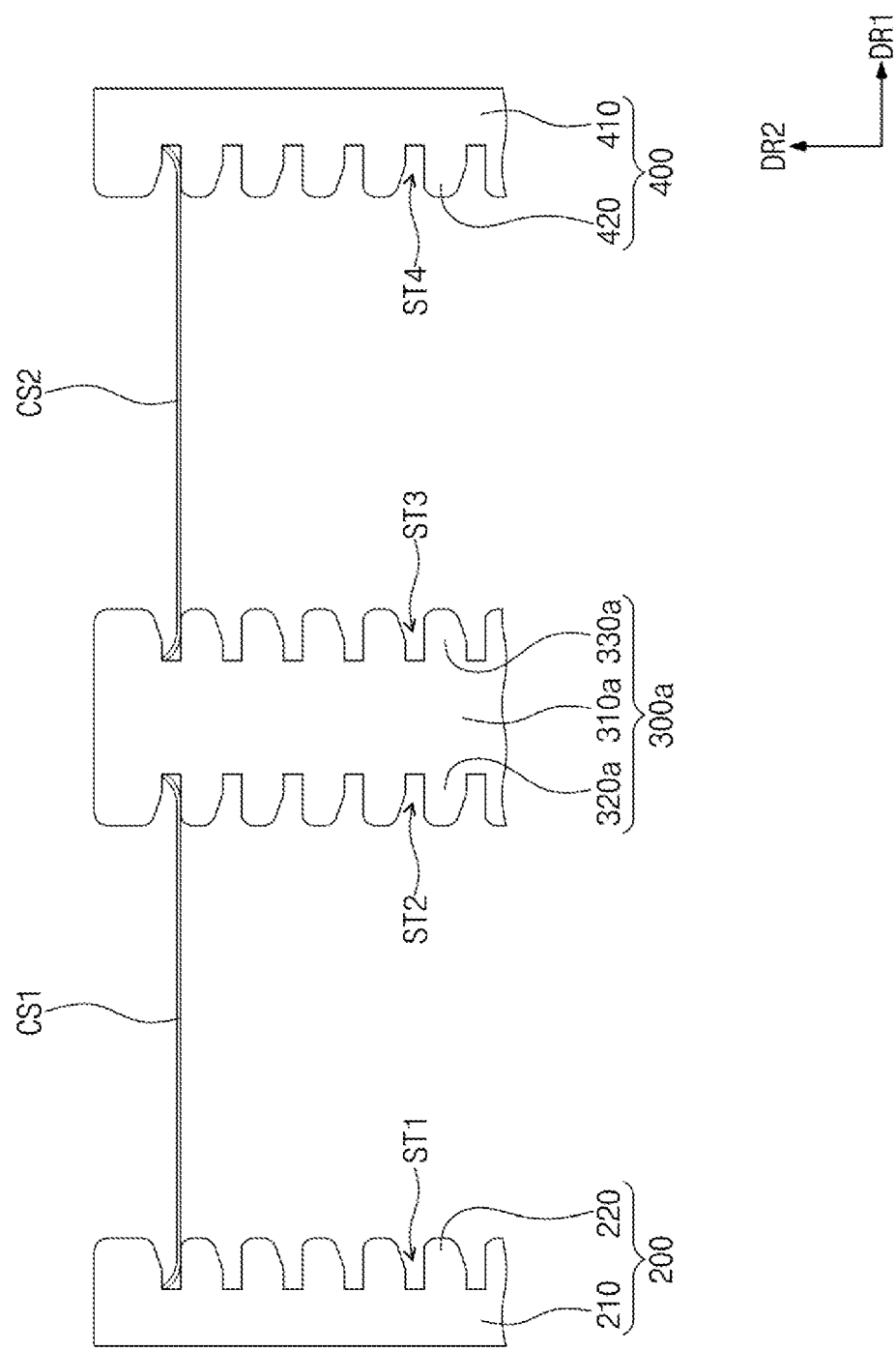
FIG. 7 is a plan view of an accommodating portion of the cassette of FIG. 6.

FIG. 6 is a perspective view of another embodiment of the cassette constructed according to the principles of the invention, and FIG. 7 is a plan view of an accommodating portion of the cassette of FIG. 6.

The substrate cassette 10-1 shown in FIG. 6 may include a plate 100, a first accommodating portion 200, a second accommodating portion 300*a*, and a third accommodating portion 400 cassette. For example, the substrate cassette 10-1 of FIG. 6 is different from the substrate cassette 10 of FIG. 1 in that the third accommodating portion 400 is added, and the structure of the second accommodating portion 300*a* is changed. For example, the plate 100 and the first accommodating portion 200 of FIG. 6 may be substantially the same as those of FIG. 1. Hereinafter, the second accommodating portion 300*a* and the third accommodating portion 400 will be mainly described for descriptive convenience.

Referring to FIGS. 6 and 7, the second accommodating portion 300*a* may be disposed between the first accommodating portion 200 and the third accommodating portion 400 and may be disposed on the plate 100. The second accommodating portion 300*a* may include a second sidewall 310*a*, a plurality of second ribs 320*a*, and a plurality of third ribs 330*a*.

The second sidewall 310*a* may project from an upper surface of the plate 100 in the third direction DR3 and may extend in the second direction DR2. The second ribs 320*a* may have substantially the same shape as the second ribs 320 shown in FIG. 1 and may respectively face first ribs 220. According to the embodiment, the first ribs 220 and the second ribs 320*a* may have a substantially linearly symmetrical shape with respect to a center line substantially parallel to the second direction DR2.

The third ribs 330*a* and the second ribs 320*a* may have a linearly symmetrical shape with respect to the second sidewall 310*a* interposed therebetween. That is, the third ribs 330*a* may have substantially the same structure as the first ribs 220 and may face the third accommodating portion 400. The third ribs 330*a* may project in the first direction DR1 and may be arranged in the second direction DR2 at regular intervals. For example, the adjacent third ribs 330*a* may be spaced apart from each other by a substantially constant interval in the second direction DR2.

Each third slot ST3 may be defined by two third ribs 330*a* adjacent to each other. In particular, each third slot ST3 may include a fifth slot portion corresponding to the first slot portion PA1 shown in FIG. 3 and a sixth slot portion corresponding to the second slot portion PA2 shown in FIG. 3.

The third accommodating portion 400 may include a third sidewall 410 protruding from the upper surface of the plate 100 in the third direction DR3 and extending in the second direction DR2 and fourth ribs 420 protruding from the third sidewall 410.

The fourth ribs 420 may project in the first direction DR1 and may be arranged in the second direction DR2 at regular intervals. Particularly, the fourth ribs 420 may respectively face the third ribs 330a in the first direction DR1.

Each fourth slot ST4 may be defined by two adjacent fourth ribs 420. In particular, each fourth slot ST4 may include a seventh slot portion corresponding to the first slot portion PA1 shown in FIG. 3 and an eighth slot portion corresponding to the second slot portion PA2 shown in FIG. 3.

As shown in FIG. 7, one first substrate CS1 may be disposed between the first slot ST1 and the second slot ST2, and another second substrate CS2 may be disposed between the third slot ST3 and the fourth slot ST4.

As described above, the substrate cassette 10-1 may include the second ribs 320a and the third ribs 330a protruding in opposite directions, respectively, with respect to the second sidewall 310a, i.e., in a direction toward the first ribs 220 and a direction toward the fourth ribs 420.

Figure 8:
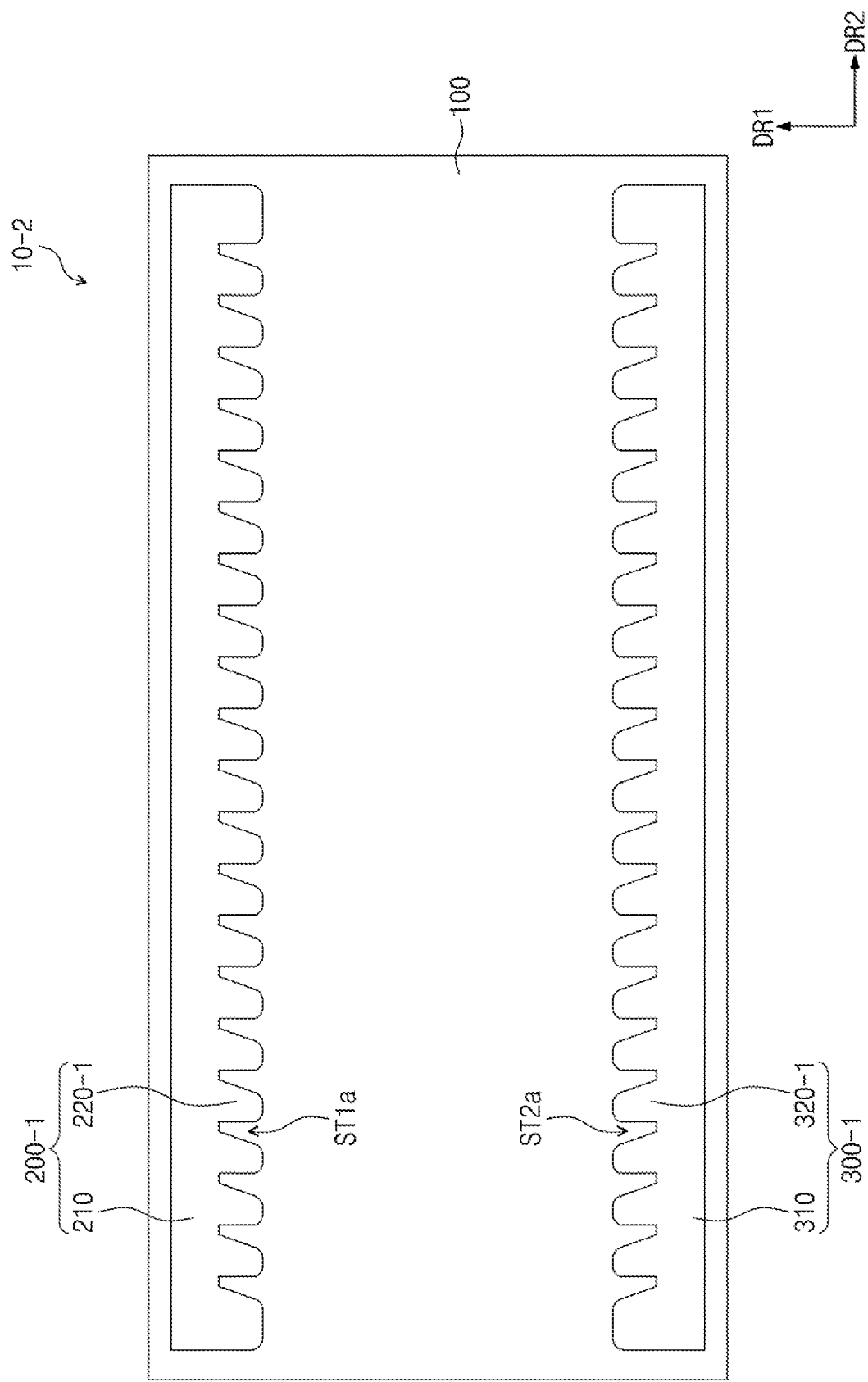
FIG. 8 is a plan view of another embodiment of the cassette constructed according to the principles of the invention.
Figure 9:
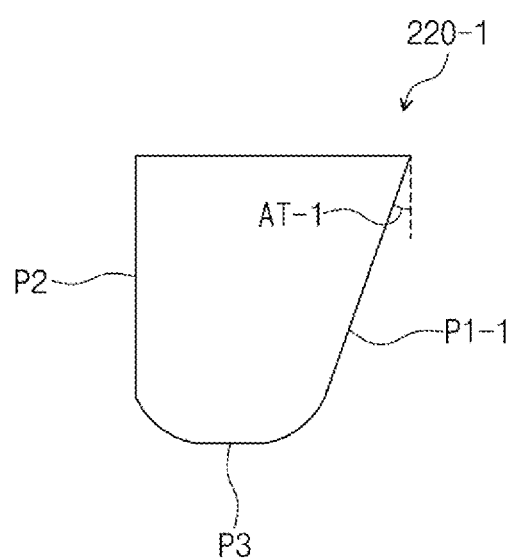
FIG. 9 is a plan view of a rib of the cassette of FIG. 8.

FIG. 8 is a plan view of another embodiment of the cassette constructed according to the principles of the invention, and FIG. 9 is a plan view of a rib of the cassette of FIG. 8.

Referring to FIGS. 8 and 9, the substrate cassette 10-2 may have substantially the same structure as the substrate cassette 10 shown in FIG. 2 except for the shape of first ribs 220-1 and second ribs 320-1. Hereinafter, the shape of the first ribs 220-1 and the second ribs 320-1 will be mainly described for descriptive convenience.

Referring to FIG. 8, the first ribs 220-1 may respectively face the second ribs 320-1 in the first direction DR1. The first ribs 220-1 and the second ribs 320-1 may be substantially linearly symmetrical with respect to a center line substantially parallel to the second direction DR2. Each first slot ST1a may be defined between two adjacent first ribs 220-1, and each second slot ST2a may be defined between two adjacent second ribs 320-1.

According to the illustrated embodiment, the width of the first slot ST1a in the second direction DR2 may gradually increase as the distance from a first sidewall 210 increases inwardly in the first direction DR1. The width of the second slot ST2a in the second direction DR2 may gradually increase as the distance from the second sidewall 310 increases inwardly in the first direction DR1.

In detail, as shown in FIG. 9, each of the first ribs 220-1 may include a first outer surface P1-1, a second outer surface P2, and a third outer surface P3. In particular, the first outer surface P1-1 shown in FIG. 9 may have an inclined shape when compared with the first outer surface P1 shown in FIG. 4. In detail, the first outer surface P1-1 may form a predetermined angle AT-1 with a reference line substantially parallel to the first direction DR1. The second ribs 320-1 may have the substantially same structure as the first ribs 220-1.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A cassette for receiving at least one substrate for a display device, the cassette comprising:
   a base portion substantially parallel to a plane defined by a first direction and a second direction perpendicular to the first direction;
   a first wall portion extending in a third direction generally perpendicular to the plane;
   a first projecting portion extending from the first wall portion in the first direction; and
   a second projecting portion extending from the first wall portion in the first direction and arranged spaced apart from the first projecting portion with respect to the second direction;
   wherein each of the first projecting portion and the second projecting portion comprises:
   a first outer surface having a first surface portion projecting from the first wall portion and being substantially parallel to the first direction, and a second surface portion inclined in a fourth direction between the first direction and the second direction;
   a second outer surface facing the first outer surface; and
   a third outer surface disposed between the first outer surface and the second outer surface, and comprising a first curved portion adjacent to the first outer surface and a second curved portion adjacent to the second outer surface,
   the first curved portion of the first projecting portion and the second curved portion of the second projecting portion face the at least one substrate.

2. The cassette of claim 1, wherein:
   a first opening is defined between the first projecting portion and the second projecting portion to receive one end of the at least one substrate,
   the first opening comprises a first portion having a first width in the second direction and a second portion having a second width greater than the first width,
   the first portion is disposed closer to the first wall portion than the second portion, and
   the first width is substantially constant.

3. The cassette of claim 2, wherein the second width gradually increases inwardly in the first direction.

4. The cassette of claim 3, wherein the second surface portion of the first outer surface is closer to the second outer surface in the second direction than the first surface portion of the first outer surface.

5. The cassette of claim 2, further comprising a second wall portion facing the first wall portion in the first direction, wherein the second wall portion extends in the third direction and comprises:
   a third projecting portion facing the first projecting portion; and
   a fourth projecting portion facing the second projecting portion;
   wherein the third projecting portion and the fourth projecting portion respectively projecting from the second wall portion in the first direction,
   and wherein the third projecting portion and the fourth projecting portion arranged in the second direction, and a second opening defined between adjacent third projecting portion and fourth projecting portion to receive the other end of the at least one substrate.

6. The cassette of claim 5, wherein the second opening comprises a third portion having the first width and a fourth portion having the second width, and the third portion is disposed closer to the second wall portion than the fourth portion.

7. The cassette of claim 6, wherein the first and second openings comprise first and second slots, respectively, and the second slot has a shape substantially linearly symmetrical to the first slot.

8. The cassette of claim 5, further comprising a third wall portion, wherein:

the second wall portion further comprises a fifth projecting portion substantially linearly symmetrical to the third projecting portion with respect to the second wall portion and a sixth projecting portion substantially linearly symmetrical to the fourth projecting portion with respect to the second wall portion, wherein the third wall portion extends in the third direction and comprises seventh projecting portion facing the fifth projecting portion, eighth projecting portion facing the sixth projecting portion, and the seventh projecting portion extending from the third wall portion in the first direction; and the eighth projecting portion extending from the third wall portion in the first direction and arranged spaced apart from the seventh projecting portion with respect to the second direction.

9. The cassette of claim 8, wherein:

a third opening is defined between adjacent fifth projecting portion and sixth projecting portion to receive one end of a second substrate, a fourth opening is defined between adjacent seventh projecting portion and eighth projecting portion to receive the other end of the second substrate, the third opening comprises a fifth portion having the first width in the second direction and a sixth portion having the second width in the second direction, the fourth opening comprises a seventh portion having the first width and an eighth portion having the second width in the second direction, the fifth portion is closer to the second wall portion than the sixth portion, and the seventh portion is closer to the third wall portion than the eighth portion.

10. The cassette of claim 9, wherein the fourth opening has a shape substantially linearly symmetrical to the third opening.

11. The cassette of claim 5, wherein the at least one substrate comprises:

a substantially flat portion;

a first edge portion bent from one end of the substantially flat portion and accommodated in the first opening; and a second edge portion bent from the other end of the substantially flat portion and accommodated in the second opening.

* * * * *